United States Patent
Ou

(10) Patent No.: US 9,197,178 B2
(45) Date of Patent: Nov. 24, 2015

(54) HEADPHONE WITH ACTIVE NOISE CANCELLING AND AUTO-CALIBRATION METHOD THEREOF

(71) Applicant: C-MEDIA ELECTRONICS INC., Taipei (TW)

(72) Inventor: Kuen-Ying Ou, Taichung (TW)

(73) Assignee: C-MEDIA ELECTRONICS INC., Taipei (TW)

( * ) Notice: Subject to any disclaimer, the term of this patent is extended or adjusted under 35 U.S.C. 154(b) by 86 days.

(21) Appl. No.: 14/247,736

(22) Filed: Apr. 8, 2014

(65) Prior Publication Data

US 2015/0092951 A1 Apr. 2, 2015

(30) Foreign Application Priority Data

Sep. 30, 2013 (TW) .............................. 102135366 A

(51) Int. Cl.
*G10K 11/16* (2006.01)
*H03G 3/20* (2006.01)
*G10K 11/178* (2006.01)
*H03G 3/24* (2006.01)
*H04R 3/00* (2006.01)
*H04R 1/10* (2006.01)

(52) U.S. Cl.
CPC .................. *H03G 3/20* (2013.01); *G10K 11/16* (2013.01); *H04R 1/1083* (2013.01); *G10K 11/178* (2013.01); *G10K 2210/1082* (2013.01); *H03G 3/24* (2013.01); *H04R 1/1008* (2013.01); *H04R 3/002* (2013.01); *H04R 2420/09* (2013.01); *H04R 2460/01* (2013.01)

(58) Field of Classification Search
None
See application file for complete search history.

(56) References Cited

U.S. PATENT DOCUMENTS

| 9,117,437 | B2 * | 8/2015 | Chin et al. | |
|---|---|---|---|---|
| 2010/0226505 | A1 * | 9/2010 | Kimura | 381/71.6 |
| 2015/0003625 | A1 * | 1/2015 | Uhle et al. | 381/71.6 |

* cited by examiner

*Primary Examiner* — Andrew L Sniezek
(74) *Attorney, Agent, or Firm* — Li & Cai Intellectual Property (USA) Office

(57) ABSTRACT

A headphone with active noise cancelling and auto-calibration method thereof is disclosed. The headphone includes a first gain-amplifier, an active noise cancelling module, a speaker, a measurement circuit, a calibration control circuit and USB driving circuit. Auto-calibration of the headphone is by use of a USB interface in the instant disclosure, so as to significantly reduce calibration time and then improve production efficiency.

10 Claims, 3 Drawing Sheets

HEADPHONE WITH ACTIVE NOISE CANCELLING AND AUTO-CALIBRATION METHOD THEREOF

BACKGROUND OF THE INVENTION

1. Field of the Invention

The instant disclosure relates to a headphone with active noise cancelling; in particular, to an auto-calibration method for the headphone with active noise cancelling.

2. Description of Related Art

Nowadays, electric products are increasingly popular, and audio equipment has been important equipment that people enjoy entertainment and acquire new information, wherein the headphone is further served as an electronic device listening anywhere, anytime. In order to provide a better listening experience, it must take noise cancelling method for the headphone of the user receiving environment noise simultaneously. There are two headphones according to difference of the noise cancelling method, e.g. a passive noise cancelling headphone and an active noise cancelling headphone.

Because the passive noise cancelling headphone is merely reduce noise via audio-Insulating materials, ability for noise cancelling is extremely associated with material, thickness, structural design, conformability, so that the headphone is generally very large and heavy. Additionally, because materials used for the passive noise cancelling headphone does not isolation effect for noise in low frequency band, noise in low frequency band (e.g. an engine and a blower) does not isolated. On the contrary, there is no limit above-mentioned for the active noise cancelling headphone, so the active noise cancelling headphone is very popular for the user.

Two microphone sensors are respectively placed on front of the left speaker and right speaker of the active noise cancelling headphone commercially available usually. Moreover, in the prior art, calibration of the active noise cancelling headphone is by means of adjusting variable resistor manually, and calibration method in recent days is to adjust gain value of the microphone via a digital interface and relevant calibration result is burned in the OTP memory. However, calibration procedure is still realized by means of manual adjustment; which means, after adjusting the gain value of the headphone, the gain value is burned in the OTP memory and then performing test. Therefore, a calibration time for the headphone is very long.

SUMMARY OF THE INVENTION

The instant disclosure provides a headphone with active noise cancelling, and the headphone comprises a first gain amplifier, an active noise cancelling module, a speaker, a measure circuit, a calibration control circuit and a USB driving circuit. The first gain amplifier receives a first noise audio signal and amplifies amplitude of the first noise audio signal to a second noise audio signal according to a first gain value. The active noise cancelling module is electrically connected to the first gain amplifier, and the active noise cancelling module receives the second noise audio signal and a first music audio signal and amplifies the first music audio signal to a second music audio signal, and generates the noise cancelling signal according to the second noise audio signal so as to superimpose the noise cancelling signal and the second music audio signal and then amplifies its power, and thus outputs an amplified synthetic audio signal. The speaker is electrically connected to the active noise cancelling module for broadcasting the amplified synthetic audio signal, wherein the amplified synthetic audio signal and an external noise audio signal are superimposed as a noise-reduced music audio signal. The measure circuit, in a calibration mode, receives the noise-reduced music audio signal and measures a noise-reducing numerical value of the noise-reduced music audio signal. The calibration control circuit is electrically connected to the measure circuit for receiving the noise-reducing numerical value and the calibration control circuit outputs a gain calibration value according to a comparison result of the noise-reducing numerical value and a predetermined noise-reducing threshold value. The USB driving circuit is electrically connected to the calibration control circuit for receiving the gain calibration value, wherein the USB driving circuit transmits the gain calibration value to the first gain amplifier via a GPIO interface for progressively adjusting the first gain value, so that the noise-reducing numerical value is larger than the predetermined noise-reducing threshold value.

In an embodiment of the instant disclosure, wherein in the calibration mode, if the noise-reducing numerical value is smaller than the predetermined noise-reducing threshold value, the calibration control circuit outputs the gain calibration value adjusted so as to continuously adjust the first gain amplifier.

In an embodiment of the instant disclosure, wherein in the calibration mode, if the noise-reducing numerical value is larger than the predetermined noise-reducing threshold value, a calibration task is finished and the gain calibration value corresponding is stored in the USB driving circuit.

In an embodiment of the instant disclosure, wherein the active noise cancelling module comprises a second gain amplifier, an active noise cancelling control circuit, an active noise cancelling control circuit and an adder. The second gain amplifier is electrically connected to the first gain amplifier and the second gain amplifier amplifies amplitude of the second noise audio signal according to a second gain value and outputting a third noise audio signal. The active noise cancelling control circuit is electrically connected to the second gain amplifier for receiving the third noise audio signal and reversing the third noise audio signal, and then outputs the noise cancelling signal. The third gain amplifier is electrically connected to the USB driving circuit for receiving the first music audio signal and amplifying amplitude of the first music audio signal according to a third gain value, and accordingly outputs a second music audio signal. The adder is electrically connected to the active noise cancelling control circuit and the third gain amplifier for respectively receiving the noise cancelling signal and the second music audio signal, and then the noise cancelling signal and the second music audio signal are superimposed as a synthetic audio signal.

In an embodiment of the instant disclosure, wherein the active noise cancelling module further comprises a power amplifier and a one time programmable memory. The power amplifier is electrically connected to the adder for receiving the synthetic audio signal and amplifying power of the synthetic audio signal according to a power gain value, and then transmits amplified synthetic audio signal which is power-amplified to the speaker. The one time programmable memory is electrically connected to the second gain amplifier, the third gain amplifier and the power amplifier and the one time programmable memory is used for storing the second gain value, the third gain value and the power gain value.

The instant disclosure another provides an auto-calibration method for a headphone with active noise cancelling, wherein the headphone comprises a first gain amplifier, an active noise cancelling module, a speaker, a measure circuit, a calibration control circuit and a USB driving circuit, the active noise cancelling module is electrically connected to the first gain amplifier, the speaker is electrically connected to the active noise cancelling module, the calibration control circuit is electrically connected to the measure circuit, the USB driving circuit is electrically connected to the calibration control circuit, and the auto-calibration method comprises steps of: receiving a first noise audio signal and amplifying amplitude of the first noise audio signal to a second noise audio signal according to a first gain value via the first gain amplifier; receiving the second noise audio signal and a first music audio signal and amplifying the first music audio signal to a second music audio signal, and generating a noise cancelling signal according to the second noise audio signal so as to superimpose the noise cancelling signal and the second music audio signal and then amplifying its power, and thus outputting an amplified synthetic audio signal, via the active noise cancelling module; broadcasting the amplified synthetic audio signal via the speaker, wherein the amplified synthetic audio signal and an external noise audio signal are superimposed as a noise-reduced music audio signal; receiving the noise-reduced music audio signal and measuring a noise-reducing numerical value of the noise-reduced music audio signal via the measure circuit in a calibration mode; receiving the noise-reducing numerical value and outputting a gain calibration value according to a comparison result of the noise-reducing numerical value and a predetermined noise-reducing threshold value via the calibration control circuit; and receiving the gain calibration value via the USB driving circuit. The USB driving circuit transmits the gain calibration value to the first gain amplifier via a GPIO interface for progressively adjusting the first gain value, so that the noise-reducing numerical value is larger than the predetermined noise-reducing threshold value.

In summary, the headphone with active noise cancelling and auto-calibration method thereof provided by the instant disclosure is able to acquire a gain calibration value via measurement and calculation of the measure circuit and the calibration control circuit, and transmit the gain calibration value to the first gain amplifier via the GPIO interface and the USB driving circuit for progressively adjusting the first gain value of the microphone so that the noise-reducing numerical value is larger than the predetermined noise-reducing threshold value. Accordingly, the headphone of the instant disclosure is able to achieve auto-calibration totally with need of manual adjustment, and thus it is not only able to significantly reduce calibration time for increasing efficiency of mass production, but also increase matches of ears listening to the audio for the user.

For further understanding of the instant disclosure, reference is made to the following detailed description illustrating the embodiments and examples of the instant disclosure. The description is only for illustrating the instant disclosure, not for limiting the scope of the claim.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION OF PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

It will be understood that, although the terms first, second, third, and the like, may be used herein to describe various elements, components, regions, layers and/or sections, these elements, components, regions, layers and/or sections should not be limited by these terms. These terms are only to distinguish one element, component, region, layer or section from another region, layer or section discussed below could be termed a second element, component, region, layer or section without departing from the teachings of the present disclosure. As used herein, the term "and/or" includes any and all combinations of one or more of the associated listed items.

[Embodiment of the Headphone with Active Noise Cancelling]

Figure 1:
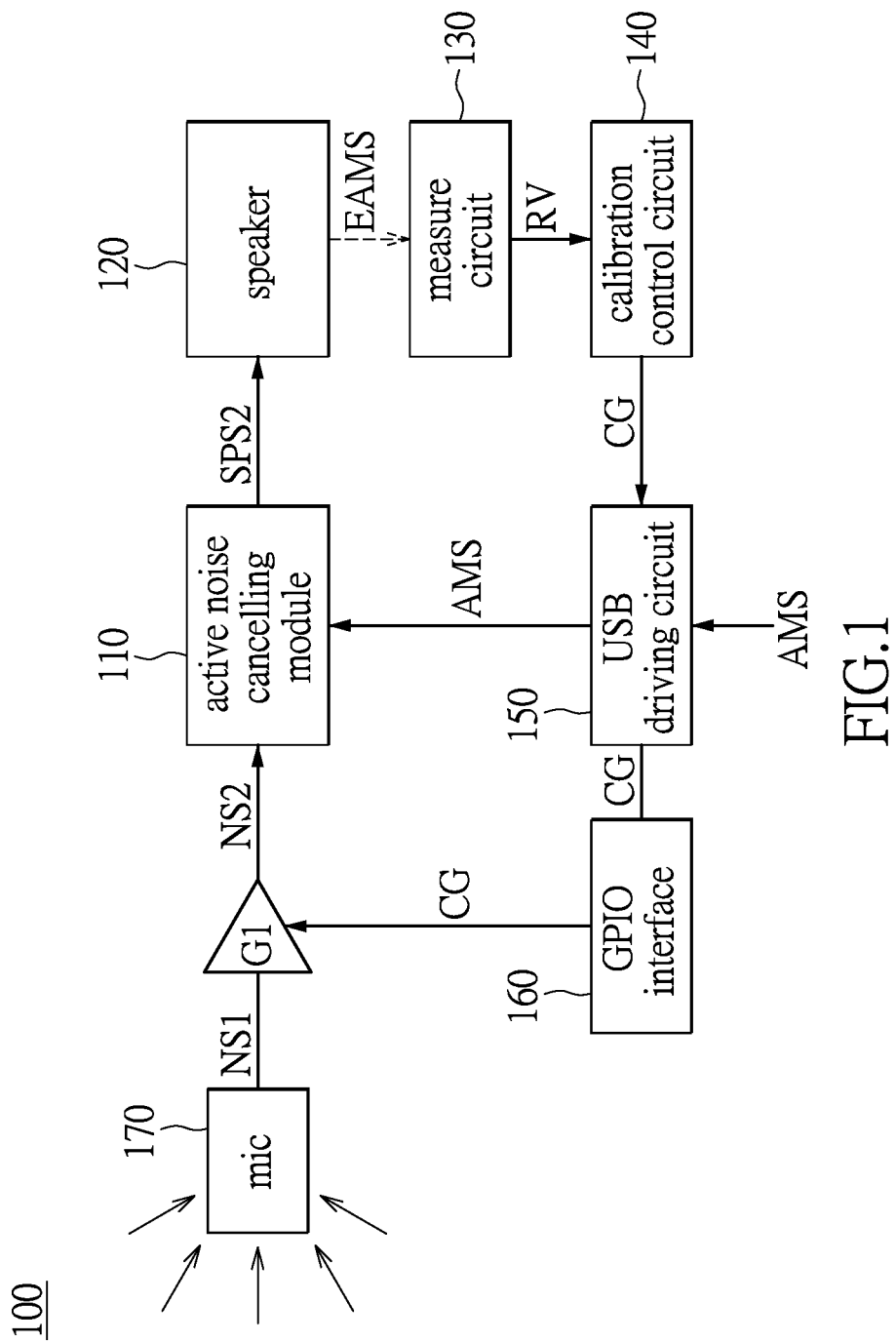
FIG. 1 shows circuit block diagram of the headphone with active noise cancelling according to one embodiment of the instant disclosure.

Referring to FIG. 1, FIG. 1 shows circuit block diagram of the headphone with active noise cancelling according to one embodiment of the instant disclosure. As shown in FIG. 1, the headphone with active noise cancelling comprises a first gain amplifier G1, an active noise cancelling module 110, a speaker 120, a measure circuit 130, a calibration control circuit 140 and a Universal Serial Bus (USB) driving circuit 150. The first gain amplifier G1 is electrically connected between a microphone 170 and the active noise cancelling module 110. The active noise cancelling module 110 is electrically connected to the speaker 120. The measure circuit 130 is electrically connected to the calibration control circuit 140 and the calibration control circuit 140 is electrically connected to the USB driving circuit 150. The USB driving circuit 150 is electrically connected to the first gain amplifier G1 via a General Purpose Input/Output (GPIO) interface 160.

Regarding the first gain amplifier G1, the first gain amplifier G1 has a first gain value, and the first gain amplifier G1 is gain amplifier for the microphone 170 and the microphone 170 is used for collecting noise generated from environment; which means, the first gain amplifier G1 amplifies amplitude of the first noise audio signal NS1 so as to generate a second noise audio signal NS2 according to a first gain value, wherein the microphone 170 may be plugged on the headphone 100 or embedded in the headphone 100.

Regarding the active noise cancelling module 110, the active noise cancelling module 110 is used for receiving the second noise audio signal NS2 transmitted from the first gain amplifier G1 and receiving and amplifying the first music audio signal AMS to a second music audio signal, and then generates a noise cancelling signal according to a second noise audio signal NS2. Afterwards, the active noise cancelling module 110 superimposes the noise cancelling signal and the second music audio signal, i.e. waveform of the noise cancelling signal is carried by waveform of the second music audio signal, and amplifies its power so as to outputs an amplified synthetic audio signal SPS2. It is worth mentioned that, because phase of the noise cancelling signal is opposite to that of the second noise audio signal NS2, the noise cancelling signal is able to totally suppress noise in the headphone in theory. However, in actual application, because mismatch of circuit element, phase of the noise cancelling signal is probably not opposite to that of the second noise audio signal NS2 exactly. Therefore, when the stereo headphone outputs an audio signal, the stereo headphone also concurrently outputs the noise cancelling signal, so that when the user listen to the audio signal, interference generated from noise will be reduced due to the noise cancelling signal.

Regarding the measure circuit 130, when the headphone 100 is in a calibration mode, the measure circuit 130 is used for receiving the noise-reduced music audio signal EAMS near the speaker 120 and measuring a noise-reducing numerical value RV of the noise-reduced music audio signal EAMS. Moreover, in one embodiment, the measure circuit 130 is able to measure matches for ears when the user wear the headphone. Furthermore, the noise-reduced music audio signal EAMS is superimposed by the amplified synthetic audio signal SPS2 and the external noise audio signal.

Regarding the calibration control circuit 140, the calibration control circuit 140 is used for receiving a noise-reducing numerical value RV acquired by measurement of the measure circuit 130. The calibration control circuit 140 compares the noise-reducing numerical value RV with the predetermined noise-reducing threshold value and outputs a gain calibration value CG according to comparison result of the noise-reducing numerical value RV and the predetermined noise-reducing threshold value, wherein the predetermined noise-reducing threshold value is set by the user, so that the headphone may achieve noise-reduced standard desired.

In the following description is further instruction in teaching a work mechanism of the headphone 100 with active noise cancelling.

In an actual application, the designer may burn design parameter in the one time programmable memory (not shown in FIG. 1) in the active noise cancelling module 110. Next, the headphone 100 of the instant disclosure may execute auto-calibration via associated circuit, such as the measure circuit 130, the calibration control circuit 140, the USB driving circuit 150 and GPIO interface 160, within the USB module of the headphone so as to increase yield and efficiency of mass production. Furthermore, when the designer or user wants to execute auto-calibration for the headphone, a predetermined noise-reducing threshold value must be set in the calibration control circuit 140 firstly and the headphone receives music (i.e. the first music audio signal AMS) via the USB driving circuit 150. Afterwards, the headphone 100 with active noise cancelling may enter into the calibration mode. The instant disclosure collects noise generated from environment via the microphone 170; which means, the first gain amplifier G1 receives the first noise audio signal NS1 transmitted from the microphone 170 and amplifies amplitude of the first noise audio signal NS1 so as to output the second noise audio signal NS2 to the active noise cancelling module 110. In the present embodiment, the active noise cancelling module 110 receives the second noise audio signal NS2 and receives the first music audio signal AMS via the USB driving circuit 150, so as to generate the noise cancelling signal according to the second noise audio signal NS2, and then the noise cancelling signal and the second music audio signal are superimposed as an overlay waveform, i.e. the noise cancelling signal is carried by the second music audio signal. Next, the active noise cancelling module 110 may generate an amplified synthetic audio signal SPS2 and output amplified synthetic audio signal SPS2 to the speaker 120 for broadcasting audio. It is worth mentioned that, the active noise cancelling module 110 has at least amplifier and perform associated signal processing according to the design parameter, wherein the design parameter is burned in the one time programmable memory with the active noise cancelling module 110.

Next, the instant disclosure receive an audio broadcasted by the speaker 120 via the measure circuit 130, and herein the audio is noise-reduced music audio signal EAMS which is superimposed by the amplified synthetic audio signal SPS2 and the external noise audio signal. The measure circuit 130 measures a noise-reducing numerical value RV of the noise-reduced music audio signal EAMS, and in one embodiment, the measure circuit 130 may measure matched for ears. The calibration control circuit 140 may receive the noise-reducing numerical value RV transmitted by the measure circuit 130 so as to compares the noise-reducing numerical value RV with the predetermined noise-reducing threshold value; which means, determining whether the noise-reducing numerical value RV is larger than the predetermined noise-reducing threshold value. If the noise-reducing numerical value RV is larger than the predetermined noise-reducing threshold value, the calibration control circuit 140 performs analysis for matches of ears for receiving the audio. If matches of ears for receiving the audio does not meet the predetermined standard (designed by the designer), the calibration control circuit 140 outputs the corresponding gain calibration value to the USB driving circuit 150 according to comparison result of the noise-reducing numerical value RV and the predetermined noise-reducing threshold value. Afterwards, the USB driving circuit 150 transmits the gain calibration value CG to the first gain amplifier G1 via the USB driving circuit 150 so as to progressively adjust or update the first gain value of the first gain amplifier G1. Additionally, if the noise-reducing numerical value RV is still smaller than the predetermined noise-reducing threshold value, the calibration control circuit 140 may output the gain calibration value CG to continuously adjust the first gain value of the first gain amplifier G1. Therefore, the noise-reducing numerical value RV measured by the measure circuit 130 may be finally larger than the predetermined noise-reducing threshold value by constantly repeating the above-mentioned work mechanism. If the noise-reducing numerical value RV measured by the measure circuit 130 is larger than the predetermined noise-reducing threshold value, the headphone 100 of the instant disclosure finishes the calibration task and the gain calibration value CG corresponding is stored in the USB driving circuit 150. When the user makes the headphone with active noise cancelling be connected to a host via USB interface for listening to music or other audio file, the USB driving circuit 150 transmits the noise-reducing numerical value RV to the first gain amplifier G1 via the GPIO interface 160 for updating the first gain value.

In short, in the calibration mode, the headphone 100 with active noise cancelling of the instant disclosure feedbacks the noise-reduced music audio signal EAMS through feedback mechanism, and measures the noise-reducing numerical value RV of the noise-reduced music audio signal EAMS via the measure circuit 130, and then outputs the gain calibration value CG to the USB driving circuit 150 by means of analysis and calculation of the calibration control circuit 140 so that the USB driving circuit 150 transmits the gain calibration value CG to the first gain amplifier G1 via the GPIO interface 160 for adjusting the first gain value used for amplifying amplitude of the first noise audio signal NS1. The headphone with active noise cancelling of the instant disclosure is able to achieve auto-calibration totally without need of manual adjustment, and thus it is not only able to significantly reduce calibration time for increasing efficiency of mass production, but also increase matches of ears listening to the audio for the user. Additionally, the headphone 100 is able to effectively reduce effect of noise component in any kind of frequency band for listening to the music for the user.

For a specific instruction on an operation process of the headphone with active noise cancelling of the instant disclosure, there is at least one of the embodiments for further instruction.

In the following embodiments, there are only parts different from embodiments in FIG. 1 described, and the omitted parts are indicated to be identical to the embodiments in FIG. 1. In addition, for an easy instruction, similar reference numbers or symbols refer to elements alike.

[Another Embodiment of the Headphone with Active Noise Cancelling]

Figure 2:
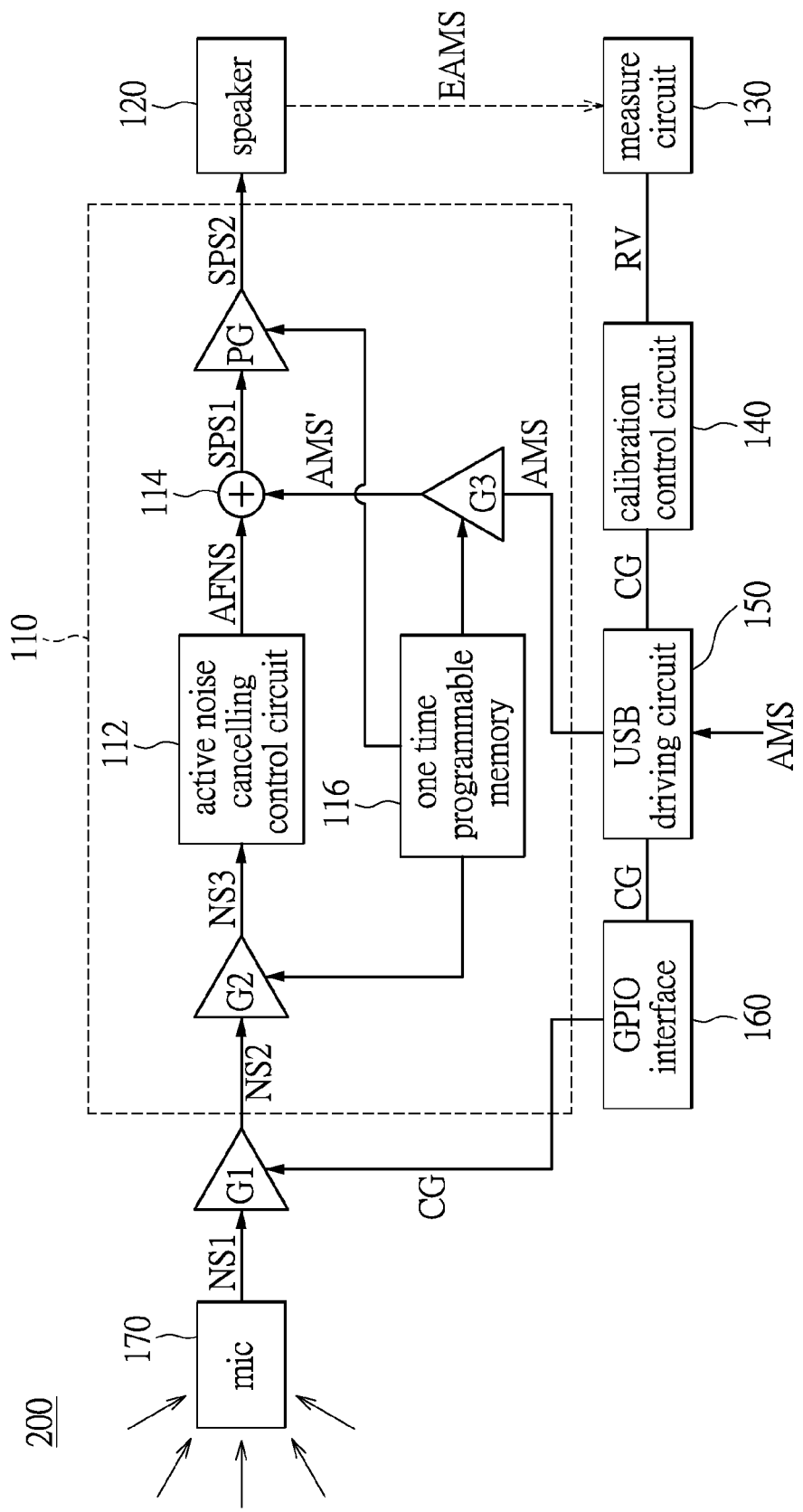
FIG. 2 shows circuit block diagram of the headphone with active noise cancelling according to another embodiment of the instant disclosure.

Referring to FIG. 2, FIG. 2 shows circuit block diagram of the headphone with active noise cancelling according to another embodiment of the instant disclosure. Difference from above-mentioned embodiment in FIG. 1 is that the active noise cancelling module 110 of the headphone with active noise cancelling comprises a second gain amplifier G2, an active noise cancelling control circuit 112, a third gain amplifier G3, an adder, a power amplifier PG and a one time programmable memory 116. Moreover, the second gain amplifier G2 is electrically connected to the first gain amplifier G1, the active noise cancelling control circuit 112 is electrically connected to the second gain amplifier G2, and the third gain amplifier G3 is electrically connected to the USB driving circuit 150. The adder 114 is electrically connected to the active noise cancelling control circuit 112 and the third gain amplifier G3, the power amplifier PG is electrically connected to the adder 114, and the one time programmable memory 116 is electrically connected to the second gain amplifier G2, the third gain amplifier G3 and the power amplifier PG.

The second gain amplifier G2 is used for receiving the second noise audio signal NS2 transmitted from the first gain amplifier G1, and the second gain amplifier G2 further amplifies amplitude of the second noise audio signal NS2 according to the second gain value, so as to output the third noise audio signal NS3 to the active noise cancelling control circuit 112. The active noise cancelling control circuit 112 receiving the third noise audio signal NS3 and after reversing phase of the third noise audio signal NS3, the noise cancelling signal AFNS is outputted; which means, phase difference between the third noise audio signal NS3 and the noise cancelling signal AFNS is 180 degrees. Additionally, the active noise cancelling control circuit 112 may further perform signal filtering for the third noise audio signal NS3. The third gain amplifier G3 receives the first music audio signal AMS via USB driving circuit 150 and an audio input terminal, and amplifies amplitude of the first music audio signal AMS according to a third gain value so as to output the second music audio signal AMS'. Next, the adder 114 may respectively receive the noise cancelling signal AFNS and the second music audio signal AMS', and the noise cancelling signal AFNS and the second music audio signal AMS' are superimposed as a synthetic audio signal SPS1, and then the synthetic audio signal SPS1 is transmitted to the power amplifier PG by the adder 114. After the power amplifier PG receives the synthetic audio signal SPS1, the power amplifier PG amplifies power of the synthetic audio signal SPS1 according to the power gain value, and accordingly outputs an amplified synthetic audio signal SPS2 to the speaker 120 for convince of broadcasting music or other audio file. The associated operation for the measure circuit 130, the calibration control circuit 140, the USB driving circuit 150, the GPIO interface 140, the microphone 170 and the first gain amplifier G1 in the embodiment of the FIG. 2 is equal to that of above-mentioned embodiment of FIG. 1, there's no need to go into details.

[One Embodiment of an Auto-Calibration Method for the Headphone]

Figure 3:
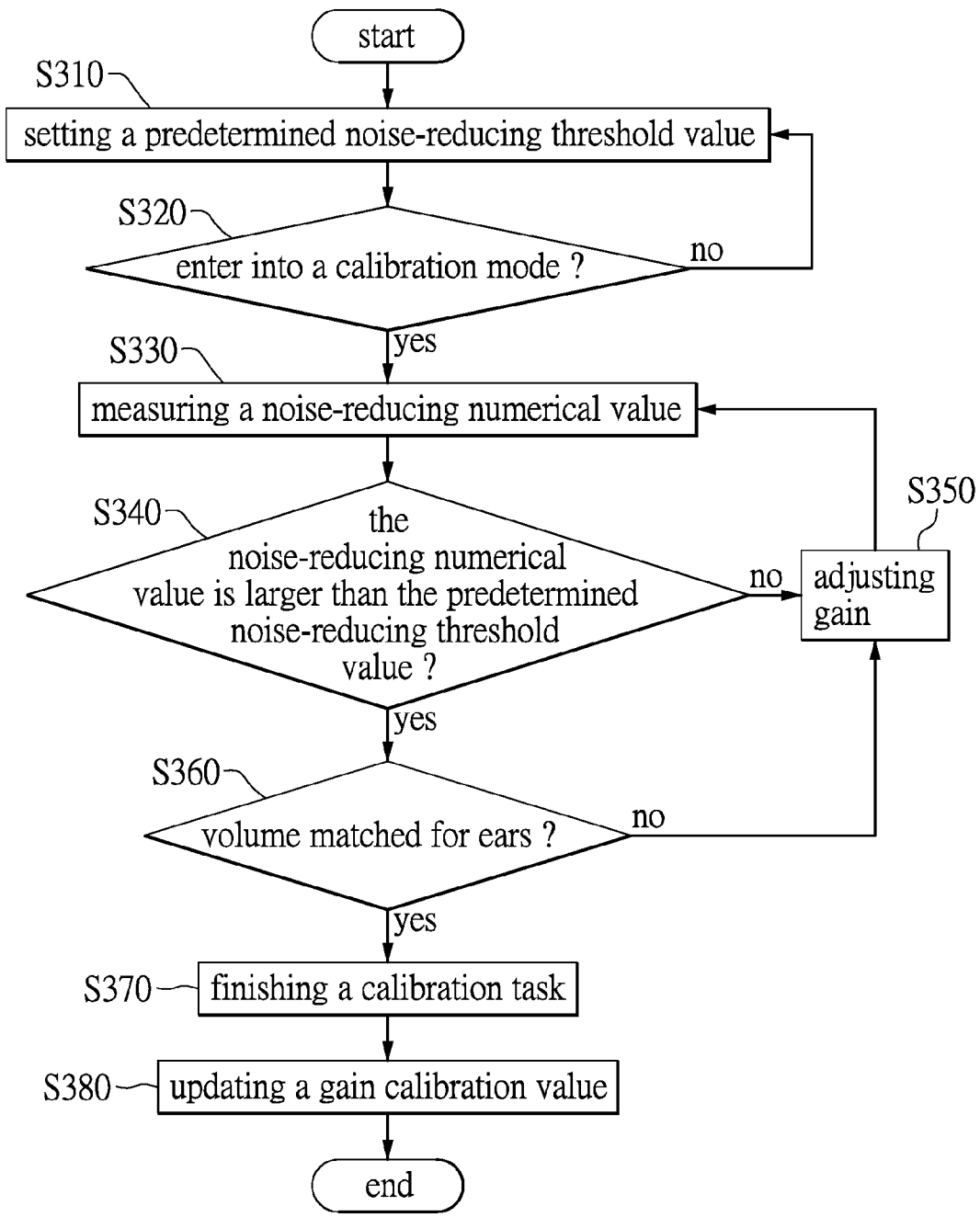
FIG. 3 shows flow chart of the auto-calibration method for the headphone according to one embodiment of the instant disclosure.

Referring to FIG. 3, FIG. 3 shows flow chart of the auto-calibration method for the headphone according to one embodiment of the instant disclosure. An explanatory sequence of steps in the present embodiment may be embodied with the headphone 200 as shown in FIG. 2, and thus please refer to FIG. 2 for an easy understanding. The auto-calibration method for the headphone with active noise cancelling comprises steps as follows: setting a predetermined noise-reducing threshold value (step S310); determining whether to enter into a calibration mode (step S320); measuring a noise-reducing numerical value (step S330); determining whether the noise-reducing numerical value is larger than a predetermined noise-reducing threshold value (step S340); adjusting gain (step S350); determining whether volume matched for ears (step S360); finishing the calibration task (step S370); updating the gain calibration value (step S380). The following will sequentially describe each step in the embodiment of FIG. 3.

In the step S310, user or designer may set the predetermined noise-reducing threshold value for the headphone with active noise cancelling, and in one embodiment, the predetermined noise-reducing threshold value is 20 dB.

In the step S320, the calibration control circuit 140 may determine whether the headphone 200 with active noise cancelling enters into the calibration mode; which means, determining whether the user performs auto-calibration. If else, the auto-calibration method returns back to the step S320; if yes, the auto-calibration method enters into the step S330.

In the step S330, if the headphone 200 enters into the calibration mode, the headphone 200 measures a noise-reducing numerical value RV of the noise-reduced music audio signal EAMS via the measure circuit 130, and the noise-reducing numerical value RV is transmitted to the calibration control circuit 140. Next, the auto-calibration method enters into the step S340.

In the step S340, the calibration control circuit 140 compares the noise-reducing numerical value RV with a predetermined noise-reducing threshold value, and transmits the gain calibration value to the USB driving circuit 150 according to comparison result. If the noise-reducing numerical value RV is smaller than the predetermined noise-reducing threshold value, the auto-calibration method enters into the step S350; if the noise-reducing numerical value RV is larger than the predetermined noise-reducing threshold value, the auto-calibration method enters into the step S360.

In the step S350, the USB circuit 150 transmits the gain calibration value CG to the first gain amplifier G1 via a GPIO interface for adjusting the first gain value, and then returns back to the step S330, so that the noise-reducing numerical value RV is larger than the predetermined noise-reducing threshold value via operation of the active noise cancelling module.

In the step S360, in one embodiment, the auto-calibration method further determines whether volume received by ears is matched via measurement of the measure circuit 130. If matches of volume received by ears meet design specification, the auto-calibration method enters into the step S370 so as to finish the calibration task. If matches of volume received by ears does meet design specification, the auto-calibration method enters into the step S350 for further adjusting gain of the first gain amplifier G1 via the calibration control circuit 140, the USB driving circuit 150 and the GPIO interface 160.

In the step S370, when the user finish calibration task of the headphone through above-mentioned flow, and then the gain calibration value CG corresponding is stored in the USB driving circuit 150 by the calibration control circuit 140.

In the step S380, when the user makes that the headphone 200 with active noise cancelling is connected to a host (e.g. desktop or notebook) via the USB interface for listening to music or other audio file, the gain calibration value CG is transmitted to the first gain amplifier G1 via the GPIO interface by the USB driving circuit 150 for updating the first gain value.

Relevant details of the steps of the headphone with active noise cancelling are described in the embodiments of FIGS. 1-2, and thus it is not repeated thereto. It is clarified that, a sequence of steps in FIG. 3 is set for a need to instruct easily, and thus the sequence of the steps is not used as a condition in demonstrating the embodiments of the instant disclosure.

To sum up, the headphone with active noise cancelling and auto-calibration method thereof provided by the instant disclosure is able to acquire a gain calibration value via measurement and calculation of the measure circuit and the calibration control circuit, and transmit the gain calibration value to the first gain amplifier via the GPIO interface and the USB driving circuit for progressively adjusting the first gain value of the microphone so that the noise-reducing numerical value is larger than the predetermined noise-reducing threshold value. Accordingly, the headphone of the instant disclosure is able to achieve auto-calibration totally with need of manual adjustment, and thus it is not only able to significantly reduce calibration time for increasing efficiency of mass production, but also increase matches of ears listening to the audio for the user.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A headphone with active noise cancelling, comprising:
   a first gain amplifier, receiving a first noise audio signal and amplifying amplitude of the first noise audio signal to a second noise audio signal according to a first gain value;
   an active noise cancelling module, electrically connected to the first gain amplifier, the active noise cancelling module receiving the second noise audio signal and a first music audio signal and amplifying the first music audio signal to a second music audio signal, and generating a noise cancelling signal according to the second noise audio signal so as to superimpose the noise cancelling signal and the second music audio signal and then amplifying its power, and thus outputting an amplified synthetic audio signal;
   a speaker, electrically connected to the active noise cancelling module, for broadcasting the amplified synthetic audio signal, wherein the amplified synthetic audio signal and an external noise audio signal are superimposed as a noise-reduced music audio signal;
   a measure circuit, in a calibration mode, receiving the noise-reduced music audio signal and measuring a noise-reducing numerical value of the noise-reduced music audio signal;
   a calibration control circuit, electrically connected to the measure circuit for receiving the noise-reducing numerical value, the calibration control circuit outputting a gain calibration value according to a comparison result of the noise-reducing numerical value and a predetermined noise-reducing threshold value; and
   a Universal Serial Bus (USB) driving circuit, electrically connected to the calibration control circuit for receiving the gain calibration value,
   wherein the Universal Serial Bus (USB) driving circuit transmits the gain calibration value to the first gain amplifier via a General Purpose Input/Output (GPIO) interface for progressively adjusting the first gain value, so that the noise-reducing numerical value is larger than the predetermined noise-reducing threshold value.

2. The headphone with active noise cancelling according to claim 1, wherein in the calibration mode, if the noise-reducing numerical value is smaller than the predetermined noise-reducing threshold value, the calibration control circuit outputs the gain calibration value adjusted so as to continuously adjust the first gain amplifier.

3. The headphone with active noise cancelling according to claim 1, wherein in the calibration mode, if the noise-reducing numerical value is larger than the predetermined noise-reducing threshold value, a calibration task is finished and the gain calibration value corresponding is stored in the Univeral Serial Bus (USB) driving circuit.

4. The headphone with active noise cancelling according to claim 1, wherein the active noise cancelling module comprises:
   a second gain amplifier, electrically connected to the first gain amplifier, the second gain amplifier amplifying amplitude of the second noise audio signal according to a second gain value and outputting a third noise audio signal;
   an active noise cancelling control circuit, electrically connected to the second gain amplifier for receiving the third noise audio signal and reversing the third noise audio signal, and then outputting the noise cancelling signal;
   a third gain amplifier, electrically connected to the Universal Serial Bus (USB) driving circuit for receiving the first music audio signal and amplifying amplitude of the first music audio signal according to a third gain value, and accordingly outputting a second music audio signal; and
   an adder, electrically connected to an active noise cancelling control circuit and the third gain amplifier for respectively receiving the noise cancelling signal and the second music audio signal, and then the noise cancelling signal and the second music audio signal being superimposed as a synthetic audio signal.

5. The headphone with active noise cancelling according to claim 4, wherein the active noise cancelling module further comprises:
   a power amplifier, electrically connected to the adder for receiving the synthetic audio signal and amplifying power of the synthetic audio signal according to a power gain value, and then transmitting amplified synthetic audio signal which is power-amplified to the speaker; and
   an one time programmable memory, electrically connected to the second gain amplifier, the third gain amplifier and the power amplifier, the one time programmable memory being used for storing the second gain value, the third gain value and the power gain value.

6. An auto-calibration method for a headphone with active noise cancelling, the auto-calibration method comprising steps of:
   receiving a first noise audio signal and amplifying amplitude of the first noise audio signal to a second noise audio signal according to a first gain value;

receiving the second noise audio signal and a first music audio signal and amplifying the first music audio signal to a second music audio signal, and generating a noise cancelling signal according to the second noise audio signal so as to superimpose the noise cancelling signal and the second music audio signal and then amplifying its power, and thus outputting an amplified synthetic audio signal;

broadcasting the amplified synthetic audio signal, wherein the amplified synthetic audio signal and an external noise audio signal are superimposed as a noise-reduced music audio signal;

receiving the noise-reduced music audio signal and measuring a noise-reducing numerical value of the noise-reduced music audio signal in a calibration mode;

receiving the noise-reducing numerical value and outputting a gain calibration value according to a comparison result of the noise-reducing numerical value and a predetermined noise-reducing threshold value;

receiving the gain calibration value; and transmitting the gain calibration value for progressively adjusting the first gain value, so that the noise-reducing numerical value is larger than the predetermined noise-reducing threshold value.

7. The auto-calibration method according to claim 6, wherein in the calibration mode, if the noise-reducing numerical value is smaller than the predetermined noise-reducing threshold value, outputting the gain calibration value adjusted.

8. The auto-calibration method according to claim 6, wherein in the calibration mode, if the noise-reducing numerical value is larger than the predetermined noise-reducing threshold value, a calibration task is finished and the gain calibration value corresponding is stored.

9. The auto-calibration method according to claim 6, further comprising steps of:

amplifying amplitude of the second noise audio signal according to a second gain value and outputting a third noise audio signal;

receiving the third noise audio signal and reversing the third noise audio signal, and then outputting the noise cancelling signal;

receiving the first music audio signal and amplifying amplitude of the first music audio signal according to a third gain value, and accordingly outputting a second music audio signal; and respectively receiving the noise cancelling signal and the second music audio signal, and then the noise cancelling signal and the second music audio signal being superimposed as a synthetic audio signal.

10. The auto-calibration method according to claim 9, further comprising steps of:

receiving the synthetic audio signal and amplifying power of the synthetic audio signal according to a power gain value, and then transmitting amplified synthetic audio signal.

* * * * *